United States Patent
Fuller et al.

(10) Patent No.: US 6,498,726 B2
(45) Date of Patent: Dec. 24, 2002

(54) HEAT DISSIPATION IN ELECTRICAL APPARATUS

(75) Inventors: Colin Fuller, Baildon (GB); Anthony Bristow, Halifax (GB); Stephen Cross, Rochdale (GB); David Woodhouse, Haworth (GB); David Sturge, Shipley (GB)

(73) Assignee: Pace Micro Technology Plc, Shipley (GB)

( * ) Notice: Subject to any disclaimer, the term of this patent is extended or adjusted under 35 U.S.C. 154(b) by 0 days.

(21) Appl. No.: 09/737,203

(22) Filed: Dec. 14, 2000

(65) Prior Publication Data

US 2001/0008481 A1 Jul. 19, 2001

(30) Foreign Application Priority Data

Dec. 17, 1999 (GB) ............................................. 9929800

(51) Int. Cl.$^7$ ................................................. H05K 7/20

(52) U.S. Cl. ...................... 361/704; 361/707; 361/719; 361/720; 165/80.2; 165/185

(58) Field of Search ................................. 361/687, 688, 361/690, 709, 707, 719, 720; 257/712, 718, 719, 727; 174/16.1, 16.3; 165/80.3, 104.33, 185

(56) References Cited

U.S. PATENT DOCUMENTS

| | | | | |
|---|---|---|---|---|
| 4,924,352 A | | 5/1990 | Septfons | 361/388 |
| 5,307,236 A | * | 4/1994 | Rio et al. | 361/720 |
| 5,313,362 A | * | 5/1994 | Hatada et al. | 361/709 |
| 5,467,251 A | * | 11/1995 | Katchmar | 361/719 |
| 5,673,176 A | | 9/1997 | Penniman et al. | 361/687 |
| 5,991,155 A | | 11/1999 | Kobayashi et al. | 361/705 |
| 6,025,991 A | * | 2/2000 | Saito | 361/704 |
| 6,101,095 A | * | 8/2000 | Yamaguchi et al. | 361/720 |
| 6,156,980 A | * | 12/2000 | Peugh et al. | 174/252 |

FOREIGN PATENT DOCUMENTS

| | | | |
|---|---|---|---|
| EP | 0854666 A2 | 7/1998 | H05K/5/00 |
| JP | 402138796 A * | 5/1990 | 361/720 |
| WO | WO96/23397 | 8/1996 | H05K/7/20 |

* cited by examiner

*Primary Examiner*—Boris Chervinsky
(74) *Attorney, Agent, or Firm*—Head, Johnson and Kachigian

(57) ABSTRACT

The invention relates to the provision of a cooling effect on components (6) of electrical apparatus which are mounted on an upper surface (8) of a printed circuit board (4) within a housing (2). The invention provides for the mounting of a material layer (12) which can absorb or otherwise dissipate heat and the invention allows the mounting of the said material (12) beneath the printed circuit board (4) within the housing (2) in position to provide improved cooling effect without contacting the components (6) themselves.

4 Claims, 2 Drawing Sheets

HEAT DISSIPATION IN ELECTRICAL APPARATUS

CROSS-REFERENCE TO RELATED APPLICATIONS

This application claims priority to GB Application No. 9929800.2 filed Dec. 17, 1999.

BACKGROUND OF THE INVENTION

The invention which is the subject of this application relates to a device and apparatus for use in the dissipation of heat which is generated by components within electrical apparatus when the apparatus is in operation.

The generation of heat by components such as integrated circuits when electrical apparatus is in operation is a well known problem and as a result many forms of apparatus include fans or other powered devices which are operated when the electrical apparatus is powered, to attempt to cool the components within the electrical apparatus housing. When one considers that it is believed that the life span of the components can be doubled for every 10 degree Celsius drop in operating temperature which can be achieved it will be appreciated that the temperatures in which the components operate is an important factor in product reliability. However a problem with the use of powered fans and the like to cool the air around the components is that they generate a noise which in some apparatus such as for example, broadcast data receivers for use with televisions, is unacceptable as it affects the use of the apparatus. The use of thermally conductive material is also well known wherein said material is applied to the inside surface of the housing in an attempt to provide some reduction in temperature by using the material to fill in air gaps in the housing but this material is expensive and can add considerably to the cost of the apparatus and as a result use of this form of material is still somewhat limited.

SUMMARY OF THE INVENTION

The aim of the present invention is to allow the use of thermally conductive material to provide an effective cooling effect on components within a housing of electrical apparatus and to do so in an economical manner which minimises the amount of the material which is required to be incorporated while maximising the effect of the same.

In a first aspect of the invention there is provided electrical apparatus which comprises at least one electrical or electronic component mounted within a housing, said component mounted on a first side of a printed circuit board and powered by an electricity supply when operational and, when powered, generates heat, said apparatus including thermally conductive material mounted therein to dissipate the heat generated and characterised in that said material is mounted on a raised platform mounted or on or formed by the housing in order to position the material on or adjacent the opposing side of the printed circuit board at the most efficient location to reduce heat with respect to the said component.

Preferably the component is on an upper surface of the printed circuit board and the thermally conductive material is on a lower surface.

Further preferably the thermally conductive material does not contact the component itself.

More typically the apparatus will comprise a series of components and if one thermally conductive material position is provided, that position will be determined with respect to design, heat generation and/or efficiency considerations. Alternatively, a number of locations can be provided, again, said location determined with reference to the area in which the heat is generated and/or the component locations.

In one embodiment the housing is formed of sheet material and said sheet material is formed into a platform or platforms at a designated location or locations with respect to the position of components within the housing. In one preferred embodiment the platform is formed so as to protrude upwardly from the surface of the housing which in normal use forms the base of the electrical apparatus and this allows the material to be positioned under the component or components at a required distance from the same.

In one embodiment the sheet material of the housing is sheet metal and the platform which is formed is frustoconical in shape and preferably has a series of slots formed at spaced intervals, said slots allowing two advantages, firstly the reduction in stresses on the sheet material caused by the formation of the platform and secondly the provision of air flow from externally of the housing into the same to improve the cooling effect.

Preferably solder resist material normally coated on a part or whole of the electrical apparatus and/or at least one electrical or electronic component is removed and/or not applied in the area of the thermally conductive material, such that solder is picked up in the area during the solder wave process. The extra solder on or surrounding the thermally conductive material increases the thermal conductivity and improves the Electro Magnetic Compatibility (EMC) performance in high current/high speed regions of the electrical apparatus and/or components.

In an alternative embodiment if the sheet material is a moulded plastic material then the platform can be formed as part of the mould process.

Preferably the thermally conductive material is a gel pad.

In a further aspect of the invention there is provided a method of providing a cooling effect on a component or components mounted on an upper surface of a printed circuit board within a housing of electrical apparatus, said method including the steps of identifying from tests the heat generated by the components when in operation, identifying the hottest areas within the housing and forming in the housing or locating thereon a platform upon which is mounted thermally conductive sheet material and said platform is of a size so as to position the thermally conductive material at or adjacent the underside of the printed circuit board at or adjacent to the hottest area so as to maximise the cooling effect of the material but without contacting the component or components.

The provision of the platform allows the use of a minimum of thermally conductive material, preferably provided in a sheet form, to maximum effect as the material can be positioned at the hottest areas in the housing rather than either being placed on the conventional housing inner surface which is removed from the hottest areas or alternatively the sheet material being provided in a relatively thick block to enable the same to reach the hottest areas which is prohibitively expensive.

BRIEF DESCRIPTION OF THE DRAWINGS

Specific embodiments of the invention are now described with reference to the accompanying drawings; wherein.

DETAILED DESCRIPTION OF THE PREFERRED EMBODIMENT

Figure 1:
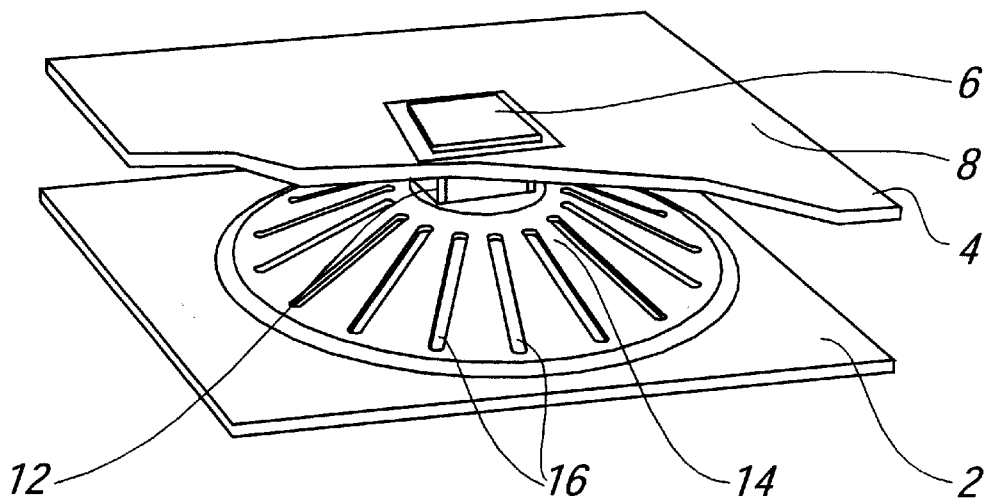
FIGS. 1–3 illustrate perspective views of the apparatus according to one embodiment.
Figure 2:
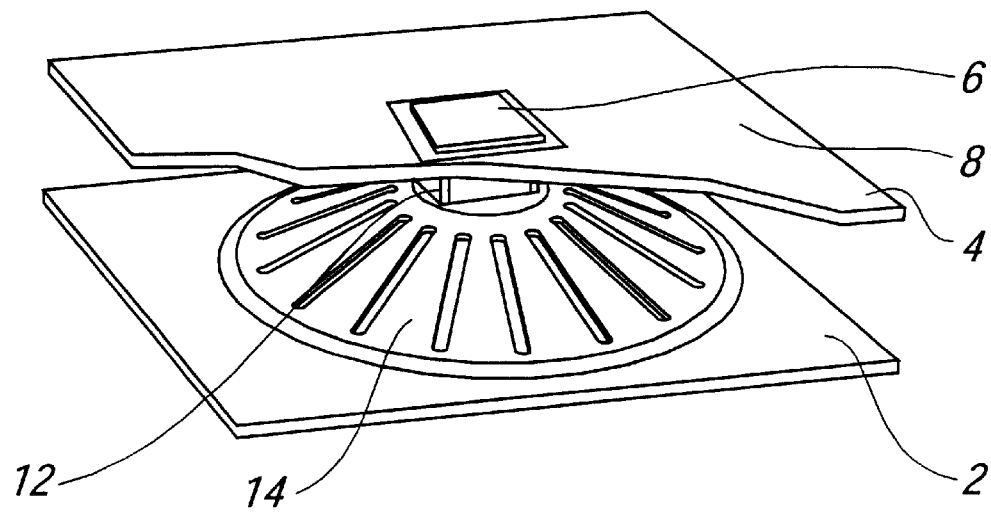
Figure 3:
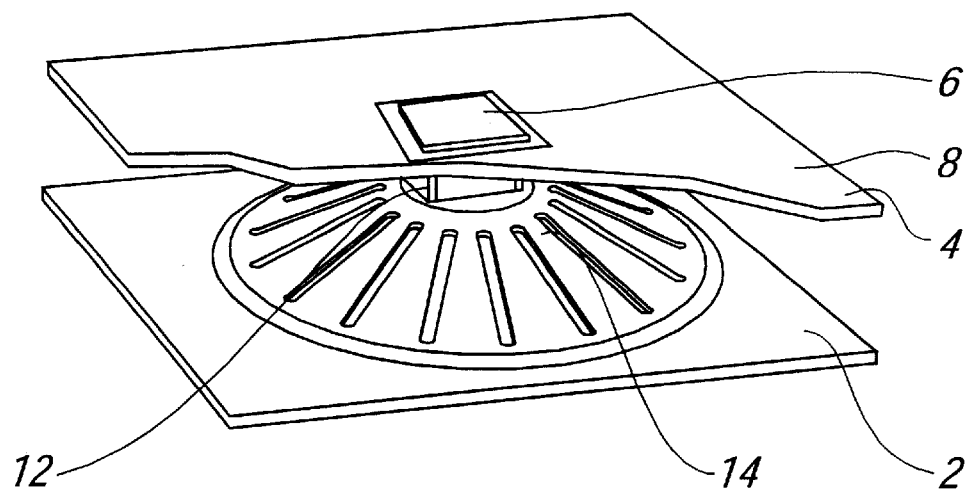
Figure 4:
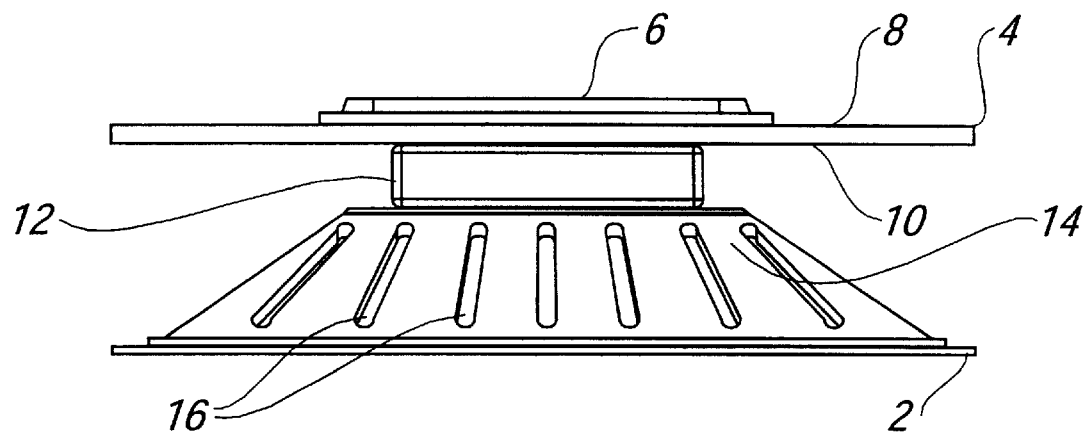
FIG. 4 illustrates an elevation of apparatus in accordance with the embodiment of the invention.

Referring to the Figures there is illustrated one embodiment of the invention wherein there is provided electrical apparatus which comprises a housing 2 and part of the base of which is shown although it should be appreciated that in practice the housing has a base, a top surface, side walls and front and rear walls. Enclosed within the housing there is provided a printed circuit board (PCB) 4 on which there are typically provided a series of components which are interconnected to perform the functions of the apparatus but for illustrative purposes only one component 6 in the form of an integrated circuit component is shown. The component is mounted on the top side 8 of the board. In contact with or adjacent to the underside 10 of the board there is located a layer of thermally conductive material 12 which is mounted on a platform 14 to raise the thermally conductive material to a designated height and position with respect to the component 6.

The platform 14 is, in this embodiment formed as part of the housing base and is formed in a frustoconical shape as shown with a series of slots 16 at spaced intervals around the wall of the same and typically is stamped or pressed as the housing is shaped and formed prior to the assembly with the PCB to form the electrical apparatus.

In use, in the design of the apparatus, analysis is undertaken to assess the position of the components within the housing and, in operation, the location of the hottest area or "hot spots" within the apparatus. When the hot spots are identified the platform or platforms can be formed so as to position the thermally conductive material at or adjacent to the hot spots underneath the printed circuit board. In one example, if a hot spot lies 10 mm above the housing base then the platform 14 is raised to a height of 7 mm which leaves a 3 mm gap which is filled by the 4 mm thick thermally conductive material 12 in the form of a gel pad. This pad which is under slight compression acts as a thermal interface between the printed circuit board and the housing. In one test undertaken the reduction in temperature achieved was found to be 23 degrees Celsius. Thus, the thermal impedance of the heat path of the PCB is significantly reduced by providing a gel pad and metal dome heatsink. The gel pad does not contact the component directly and only comes into contact with a ground plane of the underside of the PCB.

The component to be cooled is typically of a ball grid array type.

Thermal conductivity/contact between the PCB and the thermally conductive gel pad can be increased by removing solder resist material from the area of the bottom of the PCB adjacent and/or surrounding the pad. During the solder wave process in assembly of the PCB, the area of the PCB not having solder resist picks up solder, thereby reducing the thermal impedance of the heat path in the PCB. This in turn increases the reliability and performance of the PCB and electrical apparatus.

For example, in some large integrated circuits, such as ST 5512, a number of power and ground pins are employed in the centre of the circuit silicon chip to provide a thermal conductive path from the centre of the chip to reduce junction temperature. Removal of solder resist in this area to allow solder to be picked up during the solder wave process results in low thermal resistance from the PCB to the gel pad, both by eliminating the low but finite thermal resistance of i.e., the thin layer of green epoxy resist material, and by providing better contact of the gel pad to the thermal vias and surrounding plane of the PCB. Conduction of heat from the main ground plane of the PCB will also benefit heat dissipation and reduce electrical noise.

Trailing edges of the components of the PCB can be tapered to also assist in controlled solder thickness on the PCB, thereby avoiding "blobbing" of the solder.

Although described with reference to the thermally conductive material placed underneath the PCB the invention is equally applicable if placed to the top of the printed circuit board to allow the same to be cooled at the top of the component so that heat is dissipated through the upper surface of the component.

Thus the present invention provides a means of reducing the internal temperature of an integrated circuit by transferring heat via the gel pad and dissipating the heat into the housing of the apparatus surrounding the integrated circuit.

While the invention has been described with a certain degree of particularly, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. An electrical apparatus, said apparatus comprising:
   a housing of sheet material being formed into at least one raised platform protruding upwardly from a surface of said housing positioned at a location to reduce heat, said platform frustoconical in shape and having a plurality of radially arranged slots;
   a printed circuit board having first and second opposed sides;
   at least one electrical or electronic component mounted on said first side of said circuit board and generating heat when operational; and
   thermally conductive material positioned on said second side of said circuit board to dissipate the generated heat.

2. An electrical apparatus according to claim 1 wherein said thermally conductive material is in the form of a gel pad.

3. An electrical apparatus according to claim 1 wherein said apparatus includes a plurality of platforms determined by heat generation.

4. A method of providing a cooling effect on at least one component mounted on an upper surface of a printed circuit board within a housing formed of sheet material, said method comprising the steps of:
   identifying from tests the heat generated by at least one electrical or electronic component when in operation;
   identifying the hottest areas within the housing;
   forming the sheet material of the housing into a frustoconical platform having a plurality of radially arranged slots, said platform at the location of the hottest area;
   mounting to the sheet material a thermally conductive material; and
   positioning the platform having the thermally conductive material thereon at or adjacent to the underside of the printed circuit board adjacent the hottest area so as to maximize the cooling effect of the material but without contacting the component.

* * * * *